(12) United States Patent
Sekita

(10) Patent No.: US 10,771,085 B2
(45) Date of Patent: Sep. 8, 2020

(54) ROBOT, ANALOG-TO-DIGITAL CONVERTER, AND SOLID-STATE IMAGING DEVICE

(71) Applicant: SEIKO EPSON CORPORATION, Tokyo (JP)

(72) Inventor: Shinichi Sekita, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 42 days.

(21) Appl. No.: 16/200,798

(22) Filed: Nov. 27, 2018

(65) Prior Publication Data

US 2019/0165802 A1 May 30, 2019

(30) Foreign Application Priority Data

Nov. 28, 2017 (JP) ................................. 2017-227576

(51) Int. Cl.
*H04N 5/225* (2006.01)
*H03M 1/46* (2006.01)
*B25J 9/16* (2006.01)
*H04N 5/378* (2011.01)

(52) U.S. Cl.
CPC ........... *H03M 1/466* (2013.01); *B25J 9/1697* (2013.01); *H04N 5/378* (2013.01); *G05B 2219/40613* (2013.01)

(58) Field of Classification Search
CPC .................................................... H04N 5/378
See application file for complete search history.

(56) References Cited

U.S. PATENT DOCUMENTS

| | | | | |
|---|---|---|---|---|
| 6,271,783 B1 * | 8/2001 | Cairns | .................. | G09G 3/2011 341/144 |
| 6,473,021 B1 * | 10/2002 | Somayajula | ............ | H03M 1/68 341/155 |
| 2004/0125005 A1 | 7/2004 | Horie | | |
| 2005/0159842 A1 * | 7/2005 | Ban | ........................ | B25J 19/023 700/245 |

(Continued)

FOREIGN PATENT DOCUMENTS

| | | |
|---|---|---|
| JP | 2004-208011 A | 7/2004 |
| JP | 2009-005338 A | 1/2009 |

(Continued)

*Primary Examiner* — Twyler L Haskins
*Assistant Examiner* — Dwight Alex C Tejano
(74) *Attorney, Agent, or Firm* — Oliff PLC

(57) ABSTRACT

An analog-to-digital converter includes: a first to an (m+1)-th capacitive element each of which has a first end connected to a first terminal of a comparison circuit and have a predetermined capacitance ratio; and selection circuits which are connected to second ends of the capacitive elements, respectively. Each of the capacitive elements includes: a first electrode disposed in a semiconductor substrate and electrically connected to the second end; a third electrode disposed above the semiconductor substrate to oppose the first electrode and electrically connected to the second end; a second electrode disposed between the first electrode and the third electrode, above the semiconductor substrate, and electrically connected to the first end; a first insulation film disposed between the first and second electrodes; and a second insulation film disposed between the third and second electrodes.

9 Claims, 7 Drawing Sheets

(56) References Cited

U.S. PATENT DOCUMENTS

| | | | |
|---|---|---|---|
| 2008/0001804 A1* | 1/2008 | Draxelmayr | H03M 1/069 341/155 |
| 2008/0291072 A1* | 11/2008 | Sano | H03M 1/0695 341/158 |
| 2013/0147692 A1* | 6/2013 | Yamashita | G09G 3/30 345/76 |
| 2013/0200479 A1 | 8/2013 | Sakano et al. | |
| 2016/0059419 A1* | 3/2016 | Suzuki | B25J 9/1697 700/114 |

FOREIGN PATENT DOCUMENTS

| | | |
|---|---|---|
| JP | 2010-272800 A | 12/2010 |
| JP | 2013-161945 A | 8/2013 |

* cited by examiner

|    | 1  | 2  |
|----|----|----|
| 1  | C5 | C5 |
| 2  | C5 | C5 |
| 3  | C4 | C4 |
| 4  | C5 | C5 |
| 5  | C5 | C5 |
| 6  | C4 | C4 |
| 7  | C3 | C3 |
| 8  | C2 | C2 |
| 9  | C1 | C6 |
| 10 | C3 | C3 |
| 11 | C4 | C4 |
| 12 | C5 | C5 |
| 13 | C5 | C5 |
| 14 | C4 | C4 |
| 15 | C5 | C5 |
| 16 | C5 | C5 |

FIG. 7

ROBOT, ANALOG-TO-DIGITAL CONVERTER, AND SOLID-STATE IMAGING DEVICE

BACKGROUND

1. Technical Field

The present invention relates to a robot that operates based on an image obtained by taking an image of an object using a solid-state imaging device. Moreover, the invention relates to an analog-to-digital converter and a solid-state imaging device that are suitable for use in such a robot.

2. Related Art

In recent years, research and development have been conducted on robots that capture an image of an object using a solid-state imaging device (also referred to as an image sensor) and perform various operations based on the obtained image. For example, a robot has a base and two arms supported to be movable with respect to the base. Each of the base and two arms is provided with an image sensor.

In such a case, the image sensor provided in each arm of the robot is located closer to the object than the image sensor provided in the base of the robot is. Thus, movement of the arm increases image blurring. Here, to perform feedback control on movement of the robot, the image sensors that the arms of the robot are provided with are required to perform high-speed imaging at a frame rate of, for example, about 1000 frames per second.

The frame rate of a typical digital camera is 60 frames per second. From this, it can be understood that an image sensor used in the robot needs to read image information and convert an analog pixel signal into digital pixel data at high speed. To achieve this, an analog-to-digital converter is required to enable a higher conversion rate.

As a related technology, JP-A-2009-5338 discloses an analog-to-digital converter that performs A/D (analog-to-digital) conversion on analog signals by converting higher-order m bits through successive approximation and converting lower-order n bits through integration. This analog-to-digital converter includes a comparison circuit that compares a voltage applied to a first terminal with a voltage applied to a second terminal. A reference voltage is applied to the first terminal of the comparison circuit. An analog signal, a maximum reference voltage, or a minimum reference voltage are selectively applied to the second terminal of the comparison circuit via a plurality of capacitive elements. The capacitive elements have a predetermined capacitance ratio for dividing the voltage of, for example, an analog signal.

Suppose that the analog-to-digital converter disclosed in JP-A-2009-5338 has variations in capacitance values of the capacitive elements due to unintended parasitic capacitances added to the capacitive elements used in A/D conversion or due to mask misalignment or the like that occur during the manufacturing process. This results in a reduction in the A/D conversion accuracy. Here, a reduction in the capacitance value of the capacitive elements helps achieve a higher conversion rate of the analog-to-digital converter. However, the reduction in the capacitance value of the capacitive elements increases the influence of the parasitic capacitance and thus hinders the conversion rate from increasing.

SUMMARY

A first advantage of some aspects of the invention is to increase the A/D conversion accuracy by reducing variations in capacitance values of capacitive elements due to unintended parasitic capacitances added to the capacitive elements used for A/D conversion or due to mask misalignment during the manufacturing process. Moreover, a second advantage of some aspects of the invention is to reduce the sampling time and the A/D conversion time by reducing the capacitances of the capacitive elements used for A/D conversion while maintaining the accuracy of the capacitance ratio between the capacitive elements. Furthermore, a third advantage of some aspects of the invention is to provide a solid-state imaging device capable of reducing the sampling time and the A/D conversion time to achieve high-speed imaging and to provide, for example, a robot that includes such a solid-state imaging device.

To at least partially solve the stated problem, a robot according to a first aspect of the invention includes: a base; and an arm that is supported to be movable with respect to the base and includes a solid-state imaging device. The solid-state imaging device includes an analog-to-digital converter that performs analog-to-digital conversion on a pixel signal generated by reading pixel information from a light receiving element. The analog-to-digital converter includes: a comparison circuit that compares a voltage applied to a first terminal with a reference voltage applied to a second terminal, and outputs an output signal indicating a comparison result from a third terminal; capacitive elements each of which has a first end connected to the first terminal of the comparison circuit via a first line, and includes: a first to an m-th capacitive element (where m is an integer of 2 or more) that each have a predetermined capacitance ratio; and an (m+1)-th capacitive element that has a capacitance that is about the same as the capacitance of the first capacitive element; and selection circuits that are connected to second ends of the capacitive elements, respectively, via second lines. Each of the capacitive elements includes: a first electrode disposed in a semiconductor substrate and electrically connected to the second end; a third electrode disposed above the semiconductor substrate to oppose the first electrode and electrically connected to the second end; a second electrode disposed between the first electrode and the third electrode, above the semiconductor substrate, to oppose the first electrode and the third electrode and electrically connected to the first end; a first insulation film disposed between the first electrode and the second electrode; and a second insulation film disposed between the third electrode and the second electrode.

An analog-to-digital converter according to a second aspect of the invention includes: a comparison circuit that compares a voltage applied to a first terminal with a reference voltage applied to a second terminal, and outputs an output signal indicating a comparison result from a third terminal; capacitive elements each of which has a first end connected to the first terminal of the comparison circuit via a first line, and includes: a first to an m-th capacitive element (where m is an integer of 2 or more) that each have a predetermined capacitance ratio; and an (m+1)-th capacitive element that has a capacitance that is about the same as the capacitance of the first capacitive element; and selection circuits that are connected to second ends of the capacitive elements, respectively, via second lines. Each of the capacitive elements includes: a first electrode disposed in a semiconductor substrate and electrically connected to the second end; a third electrode disposed above the semiconductor substrate to oppose the first electrode and electrically connected to the second end; a second electrode disposed between the first electrode and the third electrode, above the semiconductor substrate, to oppose the first electrode and the third electrode and electrically connected to the first end; a first insulation film disposed between the first electrode and the second electrode; and a second insulation film disposed between the third electrode and the second electrode.

According to the first or second aspect of the invention, each of the second electrodes of the capacitive elements used by the analog-to-digital converter for A/D conversion is shielded between the first electrode and the third electrode. This can keep unintended parasitic capacitances from being added to the capacitive elements. Hence, the accuracy of the capacitance ratio between the capacitive elements can be enhanced, and thus the A/D conversion accuracy can also be enhanced. Moreover, the sampling time and the A/D conversion time can be reduced by reducing the capacitances of the capacitive elements while maintaining the accuracy of the capacitance ratio between the capacitive elements. Furthermore, a robot that includes a solid-state imaging device capable of reducing the sampling time and the A/D conversion time to achieve high-speed imaging can be provided.

Here, the second lines may be disposed in a layer higher than the first line. With this configuration, the distance between the first line and the second lines is increased, and thus parasitic capacitances can be reduced between the first line and the second lines.

Moreover, the capacitive elements may be configured in a capacitive cell array that includes capacitive cells disposed in rows and columns to be symmetric with respect to a symmetry axis. Each of the second to the m-th capacitive elements may include at least one capacitive cell disposed on one side of the symmetry axis, and the same number of capacitive cells as that disposed on the one side are disposed on the other side of the symmetry axis. This configuration allows the capacitive cells included in one capacitive element to be disposed in a dispersed manner, and also allows variations in the capacitance values of these capacitive cells to be averaged.

In this case, it is preferable for each of the second to the m-th capacitive elements to include at least two capacitive cells disposed symmetrically with respect to the symmetry axis. With this configuration, even when a mask used for forming any one of the electrodes becomes misaligned during the process of manufacturing the capacitive cell array, the capacitive error can be counterbalanced between the capacitive cells disposed symmetrically along the line. Hence, the capacitance ratio between the second to m-th capacitive elements can be nearly constant.

Moreover, the first capacitive element may include one capacitive cell and the (m+1)-th capacitive element may include one capacitive cell. The one capacitive cell of the first capacitive element and the one capacitive cell of the (m+1)-th capacitive element may be disposed symmetrically with respect to the symmetry axis. Each of the first capacitive element and the (m+1)-th capacitive element is configured with one capacitive cell. Thus, symmetric placement of the first capacitive element and the (m+1)-th capacitive element allows easy symmetric placement of the other capacitive elements in the capacitive cell array.

Furthermore, the second lines may be disposed symmetrically with respect to the symmetry axis in a predetermined wiring layer. This configuration makes it easy to increase the distance between the first line and the second lines in the layout of the capacitive cell array.

In the above, when an analog signal is converted into a digital signal, the first to the m-th capacitive elements may be used to generate higher-order m bits of the digital signal through successive approximation A/D conversion. The successive approximation A/D conversion allows high-speed A/D conversion and is thus suitable for generating the higher-order bits of the digital signal.

In this case, when the analog signal is converted into the digital signal, the (m+1)-th capacitive element may be used to generate an m-th bit and a subsequent bit of the digital signal through integral A/D conversion. Then, the higher-order m bits of the digital signal generated through successive approximation A/D conversion may be added to the m-th bit and the subsequent bit of the digital signal generated through the integral A/D conversion. With this, even when the capacitance value of the first capacitive element used for generating the m-th bit of the digital signal through successive approximation A/D conversion has an error, integral A/D conversion can reduce the influence of this error.

A solid-state imaging device according to a third aspect of the invention includes: a light receiving element that has a photoelectric conversion function; and the analog-to-digital converter described above. The analog-to-digital converter performs analog-to-digital conversion on a pixel signal generated by reading pixel information from the light receiving element. The third aspect of the invention can provide the solid-state imaging device capable of reducing the sampling time and the A/D conversion time to achieve high-speed imaging.

BRIEF DESCRIPTION OF THE DRAWINGS

The invention will be described with reference to the accompanying drawings, wherein like numbers reference like elements.

FIG. 7 is a plan view showing an arrangement example of the capacitive elements in a capacitive cell array.

DESCRIPTION OF EXEMPLARY EMBODIMENTS

Figure 1:
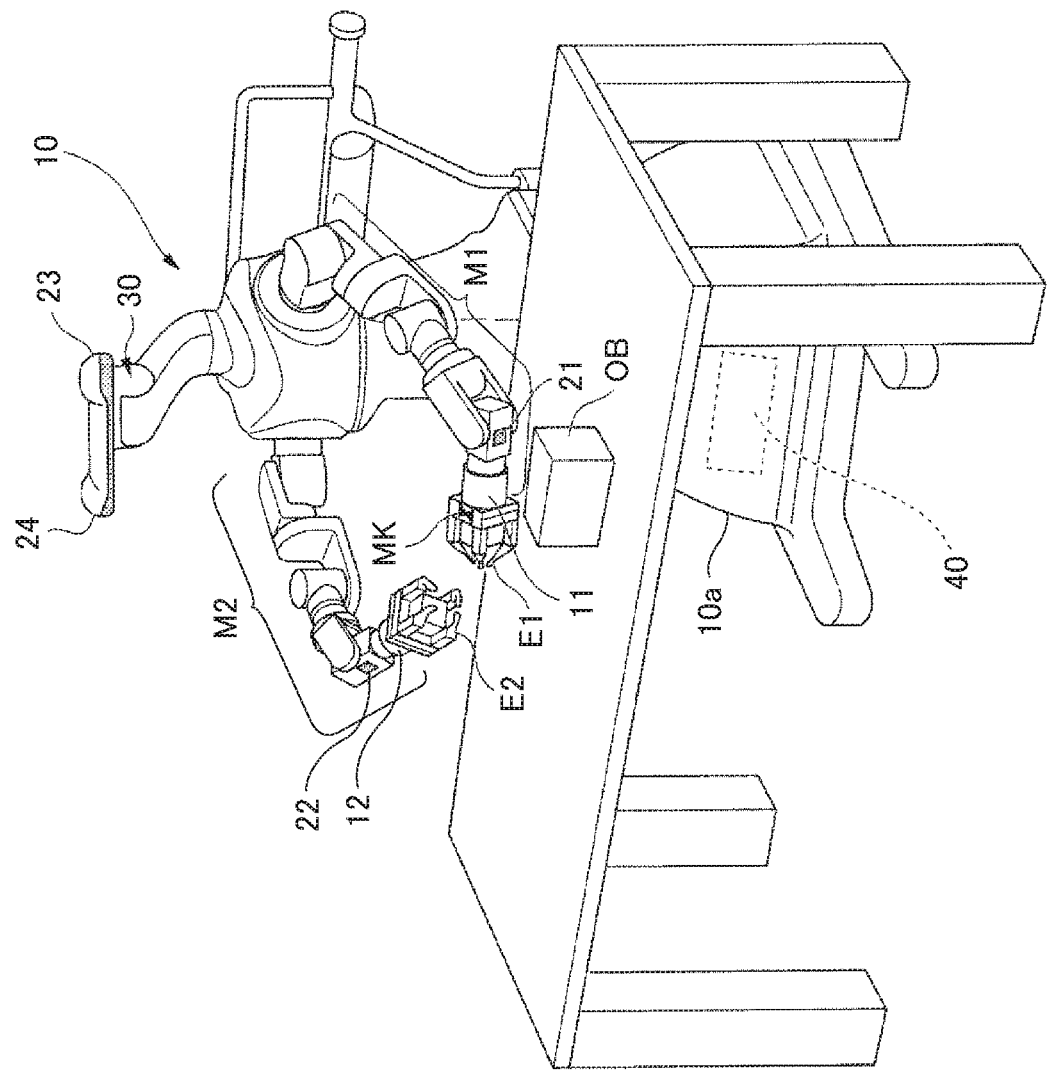
FIG. 1 is a perspective view showing a configuration example of a robot according to an embodiment of the invention.

The following describes an exemplary embodiment according to the invention, with reference to the drawings. It should be noted that the same components are denoted by the same reference numerals and the description of such components is not repeated.

Robot

FIG. 1 is a perspective view showing a configuration example of a robot according to an embodiment of the invention. A robot 10 includes: a base 10a; and at least one arm that is supported to be movable with respect to the base 10a and has an image sensor 20 (see FIG. 2).

FIG. 1 shows, as an example, a dual-arm robot that includes: a first arm that has an image sensor 21; and a second arm that has an image sensor 22. The robot 10 further includes power sensors 11 and 12, image sensors 23 and 24, a rotator 30, and a control device 40.

The first arm further includes a first support, a manipulator M1, an end effector E1, a plurality of actuators, and the power sensor 11. Similarly, the second arm further includes a second support, a manipulator M2, an end effector E2, a plurality of actuators, and the power sensor 12. In the following, the actuators included in the first arm are collectively referred to as "first actuators", and the actuators included in the second arm are collectively referred to as "second actuators".

Each of the first and second arms is a seven-axis vertical articulated arm, for example. To be more specific, the first support, the manipulator M1, and the end effector E1 of the first arm move with seven degrees of freedom in accordance with cooperative operations performed by the first actuators. Similarly, the second support, the manipulator M2, and the end effector E2 of the second arm move with seven degrees of freedom in accordance with cooperative operations performed by the second actuators. Each of the end effectors E1 and E2 has a claw that is able to grasp an object.

The first and second actuators, the power sensors 11 and 12, and the image sensors 21 to 24 can communicate with the control device 40. This communication may be established through cable communication conforming to a standard, such as Ethernet (registered trademark) or USB (Universal Serial Bus). Alternatively, the communication may be established through wireless communication conforming to a standard, such as Wi-Fi (registered trademark).

The power sensor 11 is located between the manipulator M1 and the end effector E1. The power sensor 11 detects the magnitude of power and moment acting on the end effector E1, and then transmits first power sensor information including the detected value to the control device 40. Similarly, the power sensor 12 is located between the manipulator M2 and the end effector E2. The power sensor 12 detects the magnitude of power and moment acting on the end effector E2, and then transmits second power sensor information including the detected value to the control device 40.

Based on the first power sensor information, the control device 40 generates a control signal to control the first arm through, for example, compliance control such as impedance control. Then, the control device 40 provides the control signal to the first actuators. The first actuators cause the manipulator M1 and the end effector E1 to operate according to the control signal from the control device 40.

Similarly, based on the second power sensor information, the control device 40 generates a control signal to control the second arm and then provides the control signal to the second actuators. The second actuators cause the manipulator M2 and the end effector E2 to operate according to the control signal from the control device 40.

In the example shown in FIG. 1, the image sensor 21 is provided in a portion of the manipulator M1, and the image sensor 21 moves as the first arm moves, and thus the imagable range of the image sensor 21 varies according to the movement of the first arm. Similarly, the image sensor 22 is provided in a portion of the manipulator M2, and the image sensor 22 moves as the second arm moves, and thus an imagable range of the image sensor 22 varies according to movement of the second arm. Each of the image sensors 21 and 22 perform high-speed imaging on an object OB at a frame rate of, for example, about 1000 frames per second to generate a pixel signal. Then, each of the image sensors 21 and 22 converts the pixel signal into pixel data and transmits the pixel data to the control device 40.

At least one of the first and second arms includes a mark MK. In the example shown in FIG. 1, the mark MK has a shape including two triangles, one of which is inverted to join the other. It should be noted that, instead of the shape shown in FIG. 1, the mark MK may have a different shape that can be identified by the control device 40. For example, the mark MK may be a letter, a number, or a symbol.

The following describes a case where the mark MK is provided on the surface of the end effector E1 of the first arm. When the mark MK is provided on the first arm, the image sensor 21 cannot capture an image of the mark MK. For this reason, the robot 10 needs to include at least one of the image sensors 22 to 24 to be able to capture an image of the mark MK.

In the present embodiment, the rotator 30 is provided with the image sensors 23 and 24, and the image sensors 23 and 24 rotate as the rotator 30 rotates, and thus imagable ranges of the image sensors 23 and 24 vary according to rotation of the rotator 30. Here, the image sensors 23 and 24 can perform stereoscopic imaging of the object OB.

The control device 40 built into the robot 10 generates control signals based on the pixel data received from the image sensors 21 to 24. By transmitting a control signal to each functioning unit of the robot 10, the control device 40 causes the robot to perform various operations. Alternatively, in addition to or instead of this, each of the functioning units of the robot 10 may be configured to perform a corresponding operation in response to a control signal transmitted from a control device provided outside the robot 10.

Image Sensor

Figure 2:
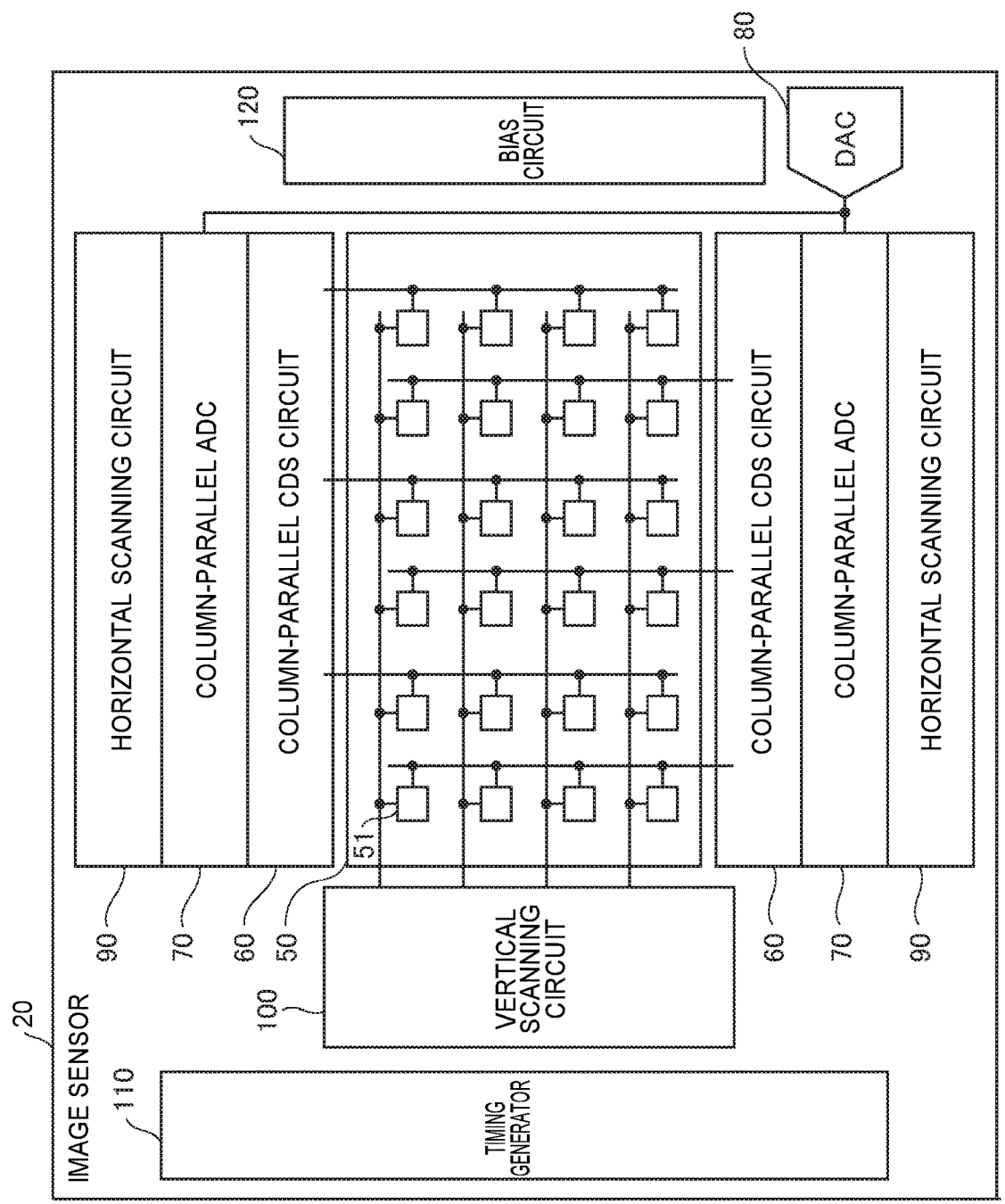
FIG. 2 is a plan view showing a configuration example of an image sensor shown in FIG. 1.

FIG. 2 is a plan view showing a configuration example of the image sensor shown in FIG. 1. As shown in FIG. 2, the image sensor (solid-state imaging device) 20 includes a pixel portion 50, a column-parallel CDS (correlated double sampling) circuit 60, a column-parallel ADC (analog-to-digital converter) 70, a DAC (digital-to-analog converter) 80, a horizontal scanning circuit 90, a vertical scanning circuit 100, a timing generator 110, and a bias circuit 120.

Here, at least one or more of the constituent elements from the pixel portion 50 to the bias circuit 120 may be built into an integrated circuit (IC), and such an IC may additionally include a different component. In the example shown in FIG. 2, a set of the column-parallel CDS circuit 60, the column-parallel ADC 70, and the horizontal scanning circuit 90 is provided on both the upper and lower sides of the pixel portion 50 as viewed in FIG. 2.

The pixel portion 50 includes: a plurality of pixels; and a plurality of light receiving elements 51 such as photodiodes that have a photoelectric conversion function, arranged in rows and columns corresponding to the pixels. The pixel portion 50 further includes a readout circuit that reads pixel information from each of the light receiving elements 51 to generate an output voltage. The vertical scanning circuit 100 includes, for example, a shift register and sequentially selects rows of the light receiving elements 51. The readout circuit outputs, to the column-parallel CDS circuit 60, the output voltage generated by reading the pixel information from each of the light receiving elements 51 on the row selected by the vertical scanning circuit 100.

The column-parallel CDS circuit 60 performs CDS processing on the output voltage generated by the readout circuit. More specifically, the column-parallel CDS circuit 60 samples an output voltage obtained immediately after the readout circuit is reset and an output voltage obtained after exposure and, based on a difference between these voltages, generates a pixel signal. With this, variations in the offset voltage between pixels can be cancelled out, and a pixel signal that corresponds to the light intensity can be generated.

The column-parallel ADC 70 includes analog-to-digital converters, corresponding to a plurality of channels, that perform A/D conversion on the pixel signals of one row provided from the column-parallel CDS circuit 60. The analog-to-digital converter of each channel generates pixel data by performing A/D conversion on the pixel signals generated by reading the pixel information from the light receiving elements 51. The column-parallel ADC 70 includes an analog-to-digital converter for one channel corresponding to one column of the light receiving elements 51. This allows A/D conversion to be performed on the pixel signals of one row at a time.

The DAC 80 is shared by the analog-to-digital converters of the channels and is used in A/D conversion performed on the pixel signals. The horizontal scanning circuit 90 includes, for example, a shift register, and sequentially selects the pixel data generated by the analog-to-digital converters of the channels. Then, the horizontal scanning circuit 90 transmits the selected pixel data to the control device 40 (shown in FIG. 1).

The timing generator 110 is configured with, for example, a gate array of a logic circuit that includes a combinational circuit and a sequential circuit. The timing generator 110 controls the operation timing of each of the parts of the image sensor 20 based on a clock signal and a control signal provided from an external source. The bias circuit 120 includes, for example, a constant current circuit and a transistor, and supplies a direct-current bias voltage and a reference voltage to the circuits of the image sensor 20.

Configuration Example of Analog-to-Digital Converter

Figure 3:
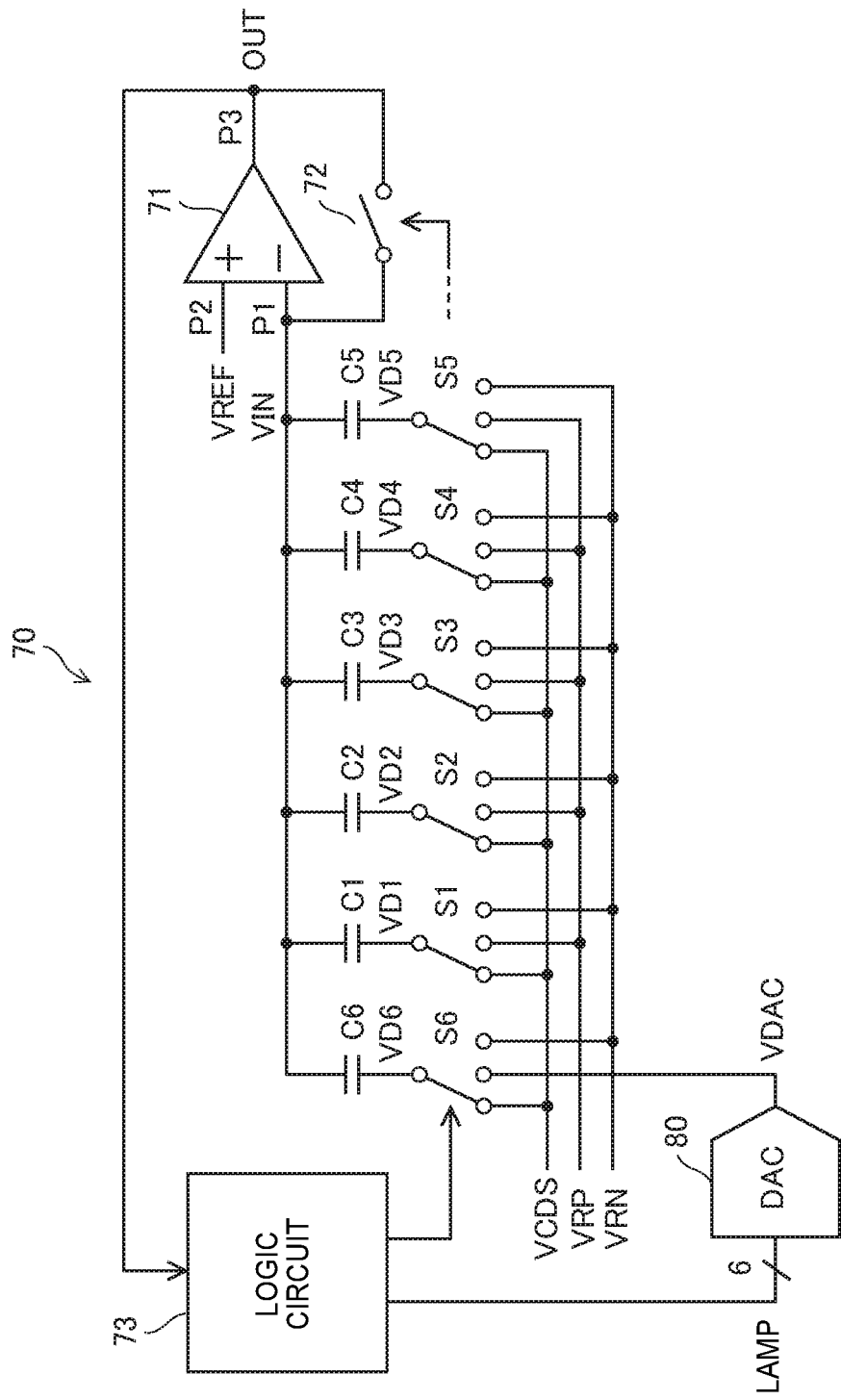
FIG. 3 is a circuit diagram showing, together with a DAC, a configuration example of a column-parallel ADC shown in FIG. 2.

FIG. 3 is a circuit diagram showing, together with a DAC, a configuration example of the column-parallel ADC shown in FIG. 2. In FIG. 3, an analog-to-digital converter corresponding to one channel that is included in the column-parallel ADC 70 is shown. Here, note that a logic circuit 73 and the DAC 80 are used sharing a channel.

In the configuration example shown in FIG. 3, an analog-to-digital converter that is a hybrid of a successive approximation ADC and an integration ADC is adopted to meet accuracy and conversion rate (i.e., the frame rate) requirements. Having a high conversion rate and low linearity accuracy, the successive approximation ADC is suitable for generating higher-order bits of a digital signal.

On the other hand, having a high linearity accuracy and a low conversion rate, the integration ADC is suitable for generating lower-order bits of a digital signal. The successive approximation ADC and the integration ADC can complement each other by being made into a hybrid, and thus both a high conversion rate and high linearity accuracy can be achieved.

As shown in FIG. 3, the analog-to-digital converter includes a comparison circuit 71, a switch circuit 72, the logic circuit 73, a plurality of capacitive elements C1 to C(m+1) (where m is an integer of 2 or more), and a plurality of selection circuits S1 to S(m+1). The analog-to-digital converter performs A/D conversion on analog pixel signals provided by the column-parallel CDS circuit 60 (shown in FIG. 2) to generate digital pixel data.

The comparison circuit 71 is configured with, for example, an operational amplifier. After comparing an input voltage VIN applied to a first terminal (an inverting input terminal) P1 with a reference voltage VREF applied to a second terminal (a non-inverting input terminal) P2, the comparison circuit 71 outputs an output signal OUT indicating the result of the comparison from a third terminal (an output terminal) P3. The switch circuit 72 is connected between the first terminal P1 and the third terminal P3 of the comparison circuit 71.

The logic circuit 73 operates in synchronization with a clock signal provided by the timing generator 110 (shown in FIG. 2). The logic circuit 73 controls the switch circuit 72 and the selection circuits S1 to S(m+1), and also generates a ramp code LAMP indicating a ramp waveform. The DAC 80 performs D/A (digital-to-analog) conversion on the ramp code LAMP provided by the logic circuit 73 to generate an output voltage VDAC.

Each of the capacitive elements C1 to C(m+1) has a first end connected to the first terminal P1 of the comparison circuit 71 via a first line. Here, this first end corresponds to a second electrode described later. The capacitive elements C1 to Cm have a predetermined capacitance ratio. The capacitance of a capacitive element C(m+1) is about the same as that of the capacitive element C1. Each of the capacitive elements C1 to C(m+1) has a second end. The selection circuits S1 to S(m+1) are connected to the second ends of the capacitive elements C1 to C(m+1), respectively, via a plurality of second lines. Here, the second end corresponds to a first electrode and a third electrode described later.

When an analog signal is converted into a digital signal, the first capacitive element C1 to the m-th capacitive element Cm are used to generate higher-order m bits of the digital signal through successive approximation A/D conversion. The successive approximation A/D conversion enables high-speed A/D conversion and is thus suitable for generating the higher-order bits of a digital signal.

Moreover, when an analog signal is converted into a digital signal, the (m+1)-th capacitive element C(m+1) may be used for generating the m-th bit and subsequent bits of the digital signal through integral A/D conversion. In this case, the higher-order m bits of the digital signal generated through the successive approximation A/D conversion are added to the m-th bit and the subsequent bits of the digital signal generated through the integral A/D conversion.

As a result, even when there is an error in the capacitance value of the capacitive element C1 used to generate the m-th bit of a digital signal through successive approximation A/D conversion, integral A/D conversion can reduce the influence of this error. It should be noted that the "m-th bit" refers to the m-th bit counted from the most significant bit (MSB) in the present specification.

Ideally, the capacitance value of an i-th capacitive element Ci between the capacitive elements C1 to C(m) is expressed as $2^{(i-1)} \cdot C$ (where i=1, 2, . . . , and m), and the capacitance value of the capacitive element C(m+1) is C. FIG. 3 shows an example where m=5. In this example, the capacitance value of the capacitive element C1 is C, the capacitance value of the capacitive element C2 is 2C, the capacitance value of the capacitive element C3 is 4C, the capacitance value of the capacitive element C4 is 8C, and the capacitance value of the capacitive element C5 is 16C. Furthermore, voltages applied to the second ends of the capacitive elements C1 to C6 are indicated as voltages VD1 to VD6.

As shown in FIG. 3, each of the selection circuits S1 to S5 selects one of a voltage VCDS of the pixel signal, a maximum reference voltage VRP, and a minimum reference voltage VRN, and applies the selected voltage to the second end of the corresponding one of the capacitive elements C1 to C5. The selection circuit S6 selects one of the voltage VCDS of the pixel signal, the output voltage VDAC of the DAC 80, and the minimum reference voltage VRN. Then, the selection circuit S6 applies the selected voltage to the second end of the capacitive element C6. The voltage VCDS of the pixel signal is not less than the minimum reference voltage VRN and not more than the maximum reference voltage VRP.

Operation Example of Analog-to-Digital Converter

1. At Time of Sampling

The logic circuit 73 performs control to cause the switch circuit 72 to be in an on state as well as causing the selection circuits S1 to S6 to select the voltage VCDS of the pixel signal. As a result of this, the first terminal P1 is connected to the third terminal P3 of the comparison circuit 73, and the comparison circuit 71 operates as a voltage follower that outputs the reference voltage VREF. The reference voltage VREF is applied to each of the first ends of the capacitive elements C1 to C6 and the voltage VCDS of the pixel signal is applied to each of the second ends of the capacitive elements C1 to C6. Thus, a potential difference between both ends of each of the capacitive elements C1 to C6 is expressed as VREF−VCDS. Then, electric charges are accumulated in the capacitive elements C1 to C6.

2. At Time of Holding

After performing control to cause the switch circuit 72 to be in an off state, the logic circuit 73 performs control to cause the selection circuits S1 to S6 to select the minimum reference voltage VRN. Since the electric charges accumulated in the capacitive elements C1 to C6 are held, the potential difference between both ends of each of the capacitive elements C1 to C6 remains as VREF−VCDS. Thus, the input voltage VIN of the comparison circuit 71 is expressed as VREF−VCDS+VRN.

3. At Time of Successive Approximation A/D Conversion

As at the time of holding, the logic circuit 73 performs control to cause the switch circuit 72 to be in the off state as well as causing the selection circuit S6 to select the minimum reference voltage VRN. Meanwhile, the logic circuit 73 sequentially causes states of the selection circuits S1 to S5 to change from the MSB side.

The input voltage VIN of the comparison circuit 71 is determined by dividing the voltage to be applied to the second ends of the capacitive elements C1 to C6 between the capacitive elements C1 to C6. In accordance with this, the level of the output signal OUT of the comparison circuit 71 becomes high or low. The logic circuit 73 estimates the voltage VCDS of the pixel signal, based on the output signal OUT of the comparison circuit 71. Then, the logic circuit 73 obtains the higher-order five bits of the pixel data and latches the obtained bits to, for example, a shift register.

The logic circuit 73 first causes the selection circuit S5 to switch to selecting the maximum reference voltage VRP. As a result, the maximum reference voltage VRP is applied to the second end of the capacitive element C5. Thus, the input voltage VIN of the comparison circuit 71 is expressed as VREF−VCDS+(VRP+VRN)/2. Then, the comparison circuit 71 determines whether the voltage VCDS of the pixel signal is larger or smaller than a voltage expressed as (VRP+VRN)/2.

When the level of the output signal OUT of the comparison circuit 71 is high, the logic circuit 73 determines that the MSB of the pixel data is "1" and holds the state of the selection circuit S5. On the other hand, when the level of the output signal OUT of the comparison circuit 71 is low, the logic circuit 73 determines that the MSB of the pixel data is "0" and causes the selection circuit S5 to switch to selecting the minimum reference voltage VRN again.

Next, the logic circuit 73 causes the selection circuit S4 to switch to selecting the maximum reference voltage VRP. When the level of the output signal OUT of the comparison circuit 71 is high, the logic circuit 73 determines that the second bit of the pixel data is "1" and holds the state of the selection circuit S4. On the other hand, when the level of the output signal OUT of the comparison circuit 71 is low, the logic circuit 73 determines that the second bit of the pixel data is "0" and causes the selection circuit S4 to switch to selecting the minimum reference voltage VRN again.

Similarly, the logic circuit 73 causes the selection circuits S3 to S1 to switch, one by one, voltage selection. As a result, the logic circuit 73 obtains the third to fifth bits. At the point where successive approximation A/D conversion has ended, the input voltage VIN of the comparison circuit 71 is lower than the reference voltage VREF. Thus, the level of the output signal OUT of the comparison circuit 71 is high.

4. At Time of Integral A/D Conversion

After the successive approximation A/D conversion, integral A/D conversion is performed. The logic circuit 73 keeps the switch circuit 72 in the off state as well as keeping the selection circuits S1 to S5 in the states they were in at the end of the successive approximation A/D conversion. On the other hand, the logic circuit 73 performs control to cause the selection circuit S6 to select the output voltage VDAC of the DAC 80.

The logic circuit 73 provides the ramp code LAMP (having six bits in the following) indicating the ramp waveform (integral waveform) to the DAC 80. The DAC 80 may perform D/A conversion on the ramp code LAMP to generate a output voltage VDAC that varies from the minimum reference voltage VRN up to the maximum reference voltage VRP. Alternatively, the DAC 80 may perform this D/A conversion to generate the output voltage VDAC that varies from a voltage expressed as VRN−ΔVR/2 up to a voltage expressed as VRP+ΔVR/2 at the maximum (where ΔVR=VRP−VRN). The latter case is described below.

As the logic circuit 73 increments the ramp code LAMP by one from "0", the output voltage VDAC of the DAC 80 increases by one increment. The application of the output voltage VDAC of the DAC 80 to the second end of the capacitive element C6 allows the input voltage VIN of the comparison circuit 71 to increase by one step.

The logic circuit 73 obtains the ramp code LAMP when the output signal OUT of the comparison circuit 71 changes from a high level to a low level. The logic circuit 73 obtains the lower-order six bits of the pixel data by subtracting a predetermined offset value from this ramp code LAMP. The capacitance value of the capacitive element C6 is about the same as that of the capacitive element C1, and the maximum variation width of the output voltage VDAC of the DAC 80 is expressed as 2·(VRP−VRN). Thus, the most significant bit of the lower-order six bits of the pixel data obtained through the integral A/D conversion corresponds to the fifth bit of the pixel data.

The logic circuit 73 adds the first to fifth bits of the pixel data obtained through the successive approximation A/D conversion to the fifth to tenth bits of the pixel data obtained through the integral A/D conversion. As a result, ten bits of pixel data is generated. For example, suppose that the pixel data of the first to fifth bits obtained through the successive approximation A/D conversion is "01010" and that the pixel data of the fifth to tenth bits obtained through the integral A/D conversion is "101010". In this case, the pixel data "0101101010" is generated. Here, the fifth bit "0" of the pixel data obtained through the successive approximation A/D conversion is corrected to "1".

Assume that the reference voltage VREF, the maximum reference voltage VRP, and the minimum reference voltage VRN do not vary during the A/D conversion operation performed by the analog-to-digital converter shown in FIG. 3. On this assumption, the input voltage VIN of the comparison circuit 71 is determined by capacitance coupling of the capacitive elements C1 to C6 and parasitic capacitances. Thus, the accuracy of the analog-to-digital converter varies substantially depending on the layout of the capacitive elements C1 to C6 and on the layout design in, for example, routing wiring.

In the present embodiment, each of the capacitive elements C1 to C6 is configured with a capacitance device that has a MOS (Metal Oxide Semiconductor) structure (such as a MOS capacitor). For example, each of the capacitive elements C1 to C6 is configured with a single capacitive cell disposed in a capacitive cell array or with a combination of capacitive cells arranged in a capacitive cell array. A unit capacitance of the capacitive cell used for, for example, an image sensor is typically designed to be several tens of fF (where f (femtometer) is $10^{-15}$ m), depending on the chip area and consumption current.

Electric connection to the capacitive elements C1 to C6 is established using a multi-layer wiring structure and a contact plug. The multi-layer wiring structure includes a layer made of a metal, such as aluminum (Al), and disposed on a semiconductor substrate via an interlayer insulation film. The contact plug is made of a metal, such as tungsten (W), and disposed in a contact hole formed in the interlayer insulation film. Here, parasitic capacitance is generated between the first line connected to the first ends of the capacitive elements C1 to C6 and the second lines connected to the second ends of the capacitive elements C1 to C6.

The total parasitic capacitance added to one capacitive cell reaches about 0.1 fF or more in some cases. Unintended parasitic capacitance can lead to an error of several percent in the unit capacitance (several tens of fF) of the capacitive cells and thus reduce the A/D conversion accuracy. Here, a reduction in the capacitance value of the capacitive elements helps achieve a higher conversion rate of the analog-to-digital converter. However, the reduction in the capacitance value of the capacitive elements increases the influence of unintended parasitic capacitance and thus hinders the conversion rate from increasing.

First Layout Example

Figure 4:
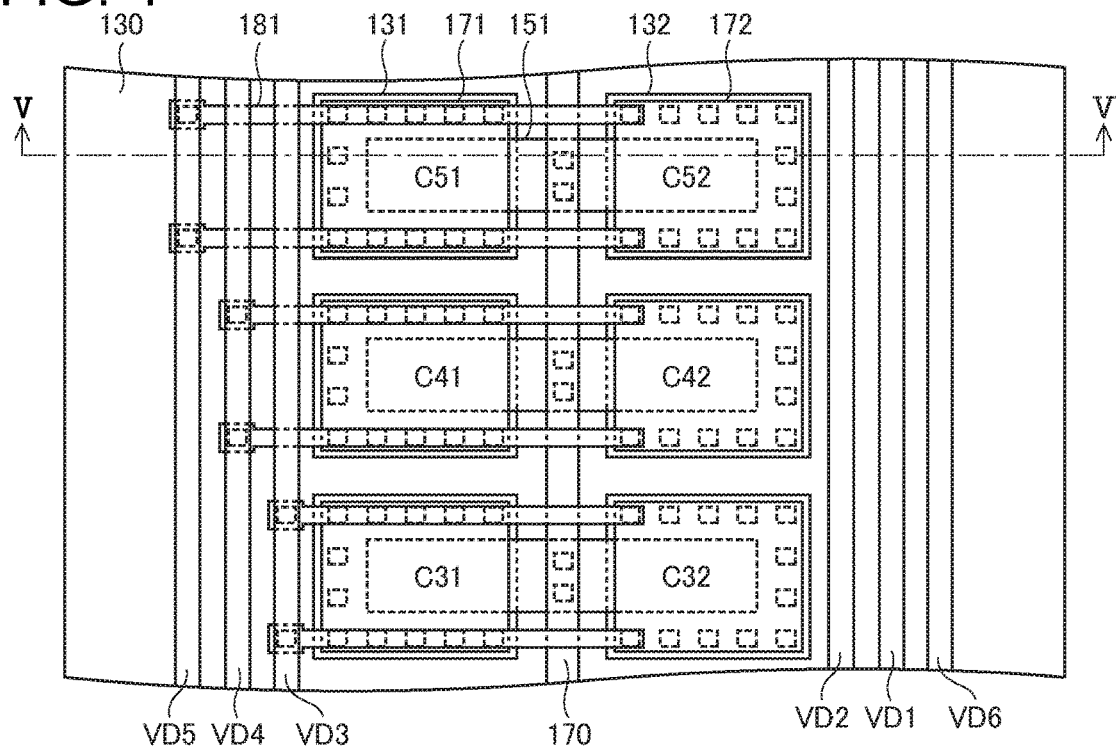
FIG. 4 is a plan view showing a first layout example of capacitive elements shown in FIG. 3.
Figure 5:
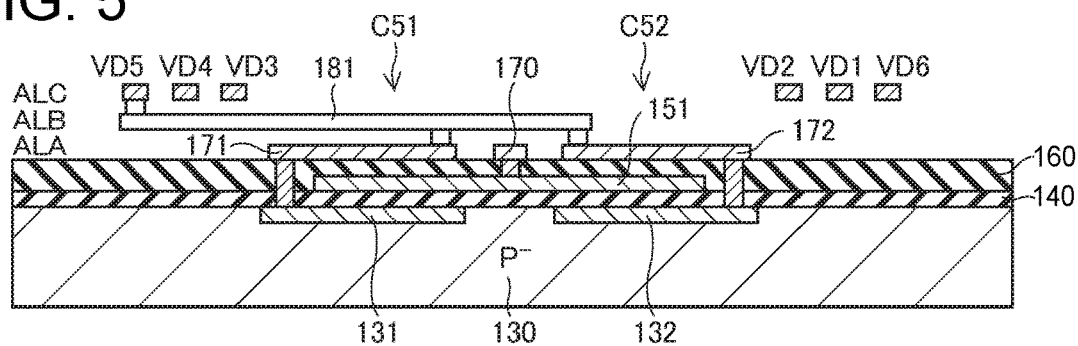
FIG. 5 is a cross-sectional view taken along line V-V of FIG. 4.

FIG. 4 is a plan view showing the first layout example of the capacitive elements shown in FIG. 3. FIG. 5 is a cross-sectional view taken along line V-V of FIG. 4. Illustration of insulation films is omitted in FIG. 4, and illustration of insulation films is partially omitted in FIG. 5.

FIG. 4 shows an example of the capacitive cells included in the capacitive elements C3 to C5 shown in FIG. 3. The capacitive element C3 is configured with four capacitive cells C31 to C34 (see FIG. 6 also). The capacitive element C4 is configured with eight capacitive cells including capacitive cells C41 and C42. The capacitive element C5 is configured with 16 capacitive cells including capacitive cells C51 and C52.

As shown in FIG. 4 and FIG. 5, the capacitive cell C51 includes a first electrode 131, a second electrode 151, and a third electrode 171. The first electrode 131 is disposed in a semiconductor substrate 130. The second electrode 151 is disposed above the semiconductor substrate 130 to oppose the first electrode 131 via a first insulation film 140. The third electrode 171 is disposed, on the side opposite to the semiconductor substrate 130-side of the second electrode 151, above the semiconductor substrate 130 to oppose the second electrode 151 via a second insulation film 160, and is electrically connected to the first electrode 131.

The capacitive cell C52 includes a first electrode 132, the second electrode 151, and a third electrode 172. The first electrode 132 is disposed in the semiconductor substrate 130. The second electrode 151 is disposed above the semiconductor substrate 130 to oppose the first electrode 132 via the first insulation film 140. The third electrode 172 is disposed, on the side opposite to the semiconductor substrate 130-side of the second electrode 151, above the semiconductor substrate 130 to oppose the second electrode 151 via the second insulation film 160, and is electrically connected to the first electrode 132. Here, the second electrode 151 is shared by the capacitive cells C51 and C52.

For example, the semiconductor substrate 130 is made of silicon (Si) containing p-type impurities, and the first electrodes 131 and 132 are formed of n-type impurity regions disposed in the semiconductor substrate 130. The first insulation film 140 is formed of a gate insulation film disposed on the semiconductor substrate 130. The second electrode 151 is configured with a gate electrode made of, for example, a polysilicon that is conductive and contains n-type or p-type impurities.

The third electrodes 171 and 172 are provided for a first wiring layer ALA disposed, via the second insulation film (interlayer insulation film) 160, on the semiconductor substrate 130 on which the gate electrode, for example, is formed. The first wiring layer ALA is further provided with a first line 170 that electrically connects the second electrode 151 to the first terminal P1 (shown in FIG. 3) of the comparison circuit 71.

Moreover, a second wiring layer ALB and a third wiring layer ALC are disposed above the first wiring layer ALA via respective interlayer insulation films. The second wiring layer ALB is provided with a relay line 181 that is electrically connected to the third electrode 171 of the capacitive cell C51 and to the third electrode 172 of the capacitive cell C52. The third wiring layer ALC is provided with the second lines that supply the respective voltages VD1 to VD6 to the second ends of the capacitive elements C1 to C6 shown in FIG. 3.

For example, the second line supplying the voltage VD5 is electrically connected to the first electrode 131 and the third electrode 171 of the capacitive cell C51 and to the first electrode 132 and the third electrode 172 of the capacitive cell C52, via the relay line 181 of the second wiring layer ALB. Here, it is preferable for the second lines to be placed as far away from the first line 170 provided for the first wiring layer ALA as possible.

Figure 6:
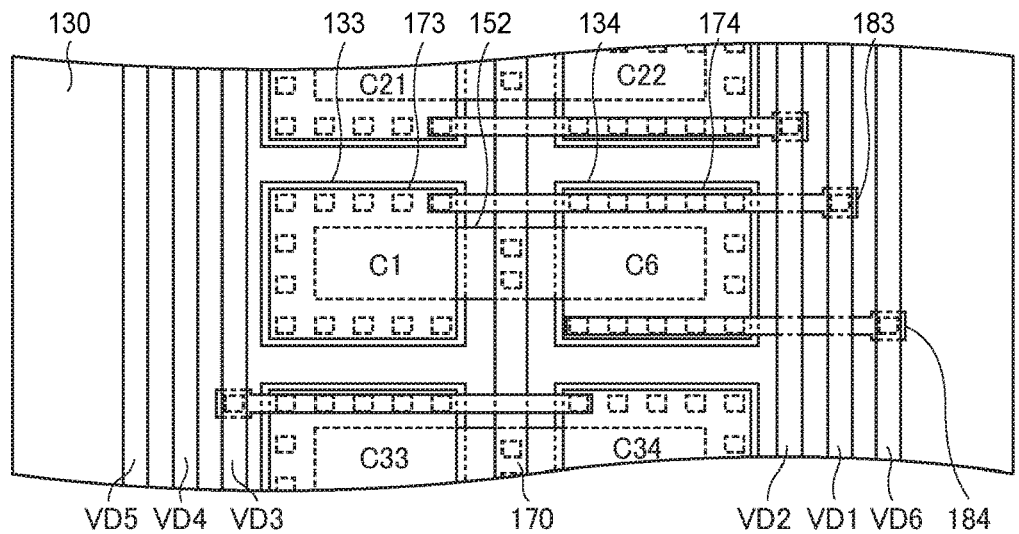
FIG. 6 is a plan view showing a different part of the layout of the capacitive elements shown in FIG. 3.

FIG. 6 is a plan view showing a different part of the layout of the capacitive elements shown in FIG. 3. Here, illustration of the insulation films is omitted in FIG. 6. FIG. 6 shows the capacitive cells included in the capacitive elements C1 to C3 shown in FIG. 3. The capacitive element C2 is configured with two capacitive cells C21 and C22. On the other hand, each of the capacitive elements C1 and C6 is configured with a single capacitive cell.

As shown in FIG. 6, the capacitive cell C1 includes a first electrode 133, a second electrode 152, and a third electrode 173. The first electrode 133 is disposed in the semiconductor substrate 130. The second electrode 152 is disposed above the semiconductor substrate 130 to oppose the first electrode 133 via a first insulation film. The third electrode 173 is disposed, on the side opposite to the semiconductor substrate 130-side of the second electrode 152, above the semiconductor substrate 130 to oppose the second electrode 152 via a second insulation film, and is electrically connected to the first electrode 133.

The capacitive cell C6 includes a first electrode 134, the second electrode 152, and a third electrode 174. The first electrode 134 is disposed in the semiconductor substrate 130. The second electrode 152 is disposed above the semiconductor substrate 130 to oppose the first electrode 134 via the first insulation film. The third electrode 174 is disposed, on the side opposite to the semiconductor substrate 130-side of the second electrode 152, above the semiconductor substrate 130 to oppose the second electrode 152 via the second insulation film, and is electrically connected to the first electrode 134. Here, the second electrode 152 is shared by the capacitive elements C1 and C6.

The first wiring layer includes the third electrodes 173 and 174 and the first line 170 that electrically connects the second electrode 152 to the first terminal P1 (shown in FIG. 3) of the comparison circuit 71. The second wiring layer includes a relay line 183 that is electrically connected to the third electrode 173 of the capacitive element C1 and a relay line 184 that is electrically connected to the third electrode 174 of the capacitive element C6.

The second line supplying the voltage VD1 is electrically connected to the first electrode 133 and the third electrode 173 of the capacitive element C1 via the relay line 183 of the second wiring layer. The second line supplying the voltage VD6 is electrically connected to the first electrode 134 and the third electrode 174 of the capacitive element C6 via the relay line 184 of the second wiring layer.

As described above, each of the capacitive elements C1 to C6 includes: a first electrode electrically connected to a corresponding one of the selection circuits S1 to S6; a second electrode electrically connected to the first terminal P1 of the comparison circuit 71; and a third electrode electrically connected to the first electrode. To be more specific, in view of the bias voltage dependence of the MOS capacitor, the first line that is connected to the first terminal P1 to which a positive bias voltage is constantly applied, in the comparison circuit 71 is connected to the second electrodes of the capacitive elements C1 to C6. Moreover, the second lines connected, respectively, to the selection circuits S1 to S6 are connected to the first electrodes and the third electrodes of the capacitive elements C1 to C6.

Here, the value of capacitance formed between the first electrode and the second electrode of the corresponding one of the capacitive elements C1 to C6 can be calculated at the designing stage. Moreover, the value of capacitance formed between the second electrode and the third electrode is proportional to the value of a capacitance formed between the first electrode and the second electrode, and thus does not influence the accuracy of the capacitance ratio between the capacitive elements C1 to C6.

According to the present embodiment, each of the second electrodes of the capacitive elements C1 to C6 used by the analog-to-digital converter for A/D conversion is shielded between the first electrode and the third electrode. This can keep unintended parasitic capacitances from being added to the capacitive elements C1 to C6. Hence, the accuracy of the capacitance ratio between the capacitive elements C1 to C6 can be enhanced, and thus the A/D conversion accuracy can also be enhanced.

Moreover, designing with consideration given to the assumed value of capacitance formed between the second electrode and the third electrode can reduce the layout area of the capacitive elements C1 to C6. Alternatively, the sampling time and the A/D conversion time can be reduced by reducing the capacitances of the capacitive elements C1 to C6 while maintaining the accuracy of the capacitance ratio between the capacitive elements C1 to C6. Furthermore, a solid-state imaging device capable of reducing the sampling time and the A/D conversion time to achieve high-speed imaging can be provided. In addition, a robot that includes such a solid-state imaging device can be provided.

Here, the second lines connected to the first electrodes and the third electrodes of the capacitive elements C1 to C6 are disposed in the layer higher than the first line connected to the second electrodes of the capacitive elements C1 to C6. With this, the distance between the first line and the second lines is increased. Thus, parasitic capacitances formed between the first line and the second lines can be reduced. It is preferable for a signal line other than the first and second lines to be also disposed in a layer higher than the first line.

FIG. 7 is a plan view showing an arrangement example of the capacitive elements in the capacitive cell array. In the example shown in FIG. 7, the capacitive elements C1 to C6 are included in a capacitive cell array that includes the capacitive cells arranged in rows and columns to be symmetric with respect to a symmetry axis A-A. Each of the capacitive elements C2 to C5 of the capacitive elements C1 to C6 is configured with: at least one capacitive cell disposed on one side of the symmetry axis A-A; and the same number of capacitive cells as that disposed on the one side are disposed on the other side of the symmetry axis A-A. This configuration allows the capacitive cells included in one capacitive element to be disposed in a dispersed manner, and also allows variations in the capacitance values of these capacitive cells to be averaged out.

In this case, it is preferable for each of the capacitive elements C2 to C5 to be configured with at least two capacitive cells disposed symmetrically with respect to the symmetry axis A-A. With this configuration, even when a mask used for forming any one of the electrodes becomes misaligned during the process of manufacturing the capacitive cell array, the capacitance error can be counterbalanced between the capacitive cells disposed symmetrically along the line. Hence, the capacitance ratio between the capacitive elements C2 to C5 can be almost constant.

For example, the capacitive element C2 is configured with one capacitive cell disposed in the eighth row of the first column and one capacitive cell disposed in the eight row of the second column. The capacitive element C3 is configured with two capacitive cells disposed in the seventh and tenth rows of the first column and two capacitive cells disposed in the seventh and tenth rows of the second column.

On the other hand, the capacitive elements C1 and C6 are configured with two capacitive cells disposed symmetrically with respect to the symmetry axis A-A. Each of the capacitive elements C1 and C6 is configured with one capacitive cell, and thus, symmetric placement of the capacitive element C1 and the capacitive element C6 allows easy symmetric placement of the other capacitive elements in the capacitive cell array. Moreover, even when the capacitive element C1 used for successive approximation A/D conversion has an error in the capacitance value, the influence of this error can be reduced through integral A/D conversion performed using the capacitive element C6.

In view of the placement of the capacitive elements C1 to C6 as described above, it is preferable for the second lines connected to the second ends of the capacitive elements C1 to C6 to be disposed symmetrically with respect to the symmetry axis A-A in a predetermined wiring layer. As shown in FIG. 4 to FIG. 6, in the third wiring layer ALC, the second lines supplying the voltages VD1 to VD6 respectively to the second ends of the capacitive elements C1 to C6 are disposed symmetrically with respect to a symmetry axis passing through the center of the first line 170 connected to the first ends of the capacitive elements C1 to C6. This configuration allows the distance between the first line and the second lines to be easily increased in the layout of the capacitive cell array.

Second Layout Example

Figure 8:
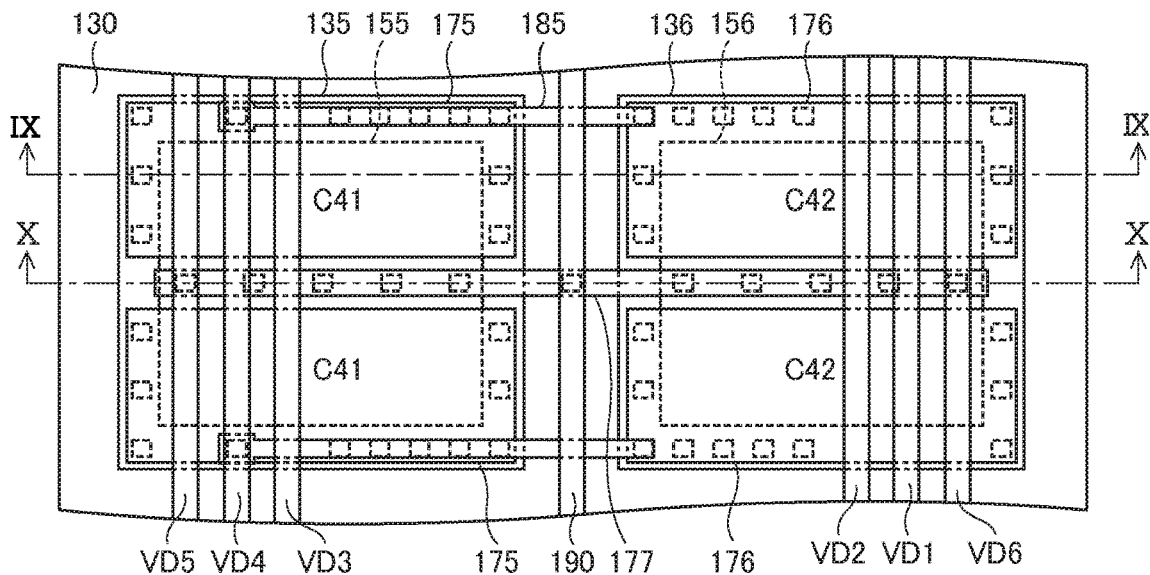
FIG. 8 is a plan view showing a second layout example of the capacitive elements shown in FIG. 3.
Figure 9:
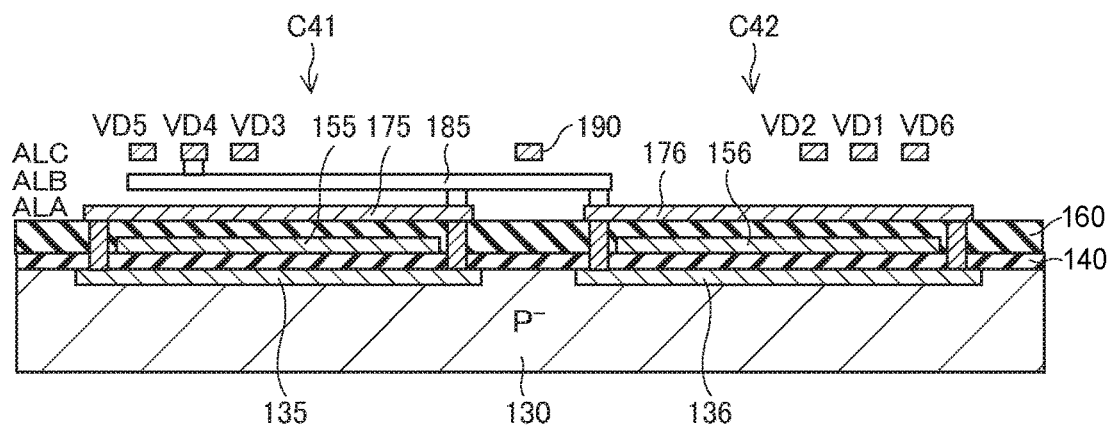
FIG. 9 is a cross-sectional view taken along line IX-IX of FIG. 8.
Figure 10:
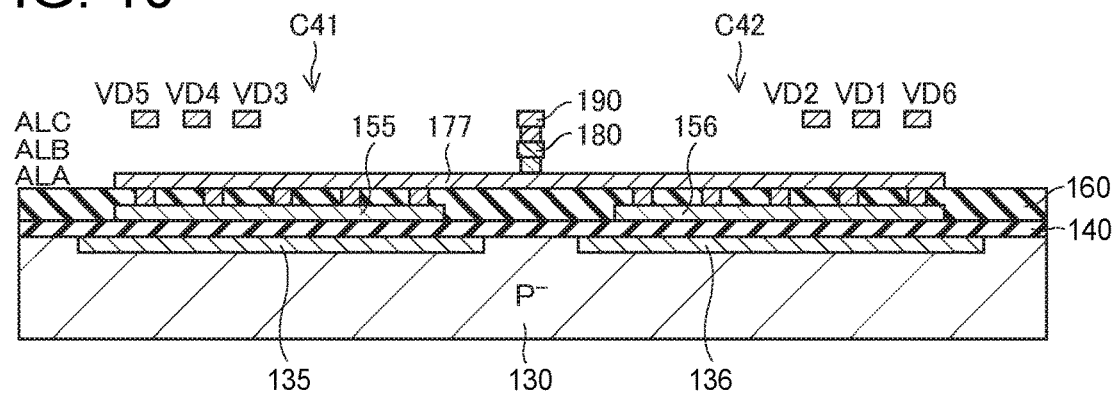
FIG. 10 is a cross-sectional view taken along line X-X of FIG. 8.

FIG. 8 is a plan view showing the second layout example of the capacitive elements shown in FIG. 3. FIG. 9 is a cross-sectional view taken along line IX-IX of FIG. 8. FIG. 10 is a cross-sectional view taken along line X-X of FIG. 8. Illustration of the insulation films is omitted in FIG. 8, and illustration of the insulation films is partially omitted in FIG. 9 and FIG. 10.

In the first layout example, the second electrode is shared by two capacitive cells adjacent to each other in the row direction. In the second layout example, the second electrode is divided according to the capacitive cells. Each of FIGS. 8 to 10 show, as an example, the capacitive cells included in the capacitive element C4 shown in FIG. 3. The capacitive element C4 is configured with the eight capacitive cells including the capacitive cells C41 and C42.

As shown in FIGS. 8 to 10, the capacitive cell C41 includes a first electrode 135, a second electrode 155, and a third electrode 175. The first electrode 135 is disposed in the semiconductor substrate 130. The second electrode 155 is disposed above the semiconductor substrate 130 to oppose the first electrode 135 via the first insulation film 140. The third electrode 175 is disposed, on the side opposite to the semiconductor substrate 130-side of the second electrode 155, above the semiconductor substrate 130 to oppose the second electrode 155 via the second insulation film 160, and is electrically connected to the first electrode 135. Here, the third electrode 175 is divided into two, upper and lower, portions in FIG. 8.

The capacitive cell C42 includes a first electrode 136, a second electrode 156, and a third electrode 176. The first electrode 136 is disposed in the semiconductor substrate 130. The second electrode 156 is disposed above the semiconductor substrate 130 to oppose the first electrode 136 via the first insulation film 140. The third electrode 176 is disposed, on the side opposite to the semiconductor substrate 130-side of the second electrode 156, above the semiconductor substrate 130 to oppose the second electrode 156 via the second insulation film 160, and is electrically connected to the first electrode 136. Here, the third electrode 176 is divided into two, upper and lower, portions in FIG. 8.

The first wiring layer ALA includes a relay line 177 that is electrically connected to the second electrode 155 of the capacitive cell C41 and to the second electrode 156 of the capacitive cell C42. The second wiring layer ALB includes: a relay line 185 that is electrically connected to the third electrode 175 of the capacitive cell C41 and to the third electrode 176 of the capacitive cell C42; and a relay line 180 that is electrically connected to the relay line 177 of the first wiring layer ALA. The third wiring layer ALC includes: a first line 190 that is electrically connected to the relay line 180 of the second wiring layer ALB; and the second lines that supply the voltages VD1 to VD6, respectively, to the second ends of the capacitive elements C1 to C6.

For example, the second line supplying the voltage VD4 is electrically connected to the first electrode 135 and the third electrode 175 of the capacitive cell C41 and to the first electrode 136 and the third electrode 176 of the capacitive cell C42, via the relay line 185 of the second wiring layer ALB. On the other hand, the second electrode 155 of the capacitive cell C41 and the second electrode 156 of the capacitive cell C42 are electrically connected to the first terminal P1 (shown in FIG. 3) of the comparison circuit 71 via the relay line 177 of the first wiring layer ALA, the relay line 180 of the second wiring layer ALB, and the first line 190 of the third wiring layer ALC. The other parts in the second layout example may be identical to those in the first layout example.

As with the first layout example, each of the second electrodes of the capacitive elements C1 to C6 used by the analog-to-digital converter for A/D conversion are shielded between the first electrode and the third electrode according to the second layout example. Moreover, with this configuration, even when a mask used for forming any one of the electrodes becomes misaligned during the process of manufacturing the capacitive cell array, variations in the capacitance values of the capacitive elements C1 and C6 each configured with a single capacitive cell can be reduced. Hence, the accuracy of the capacitance ratio between the capacitive elements can be enhanced, and thus the A/D conversion accuracy can also be enhanced.

Simulation Result of Non-Linearity Error

Figure 11:
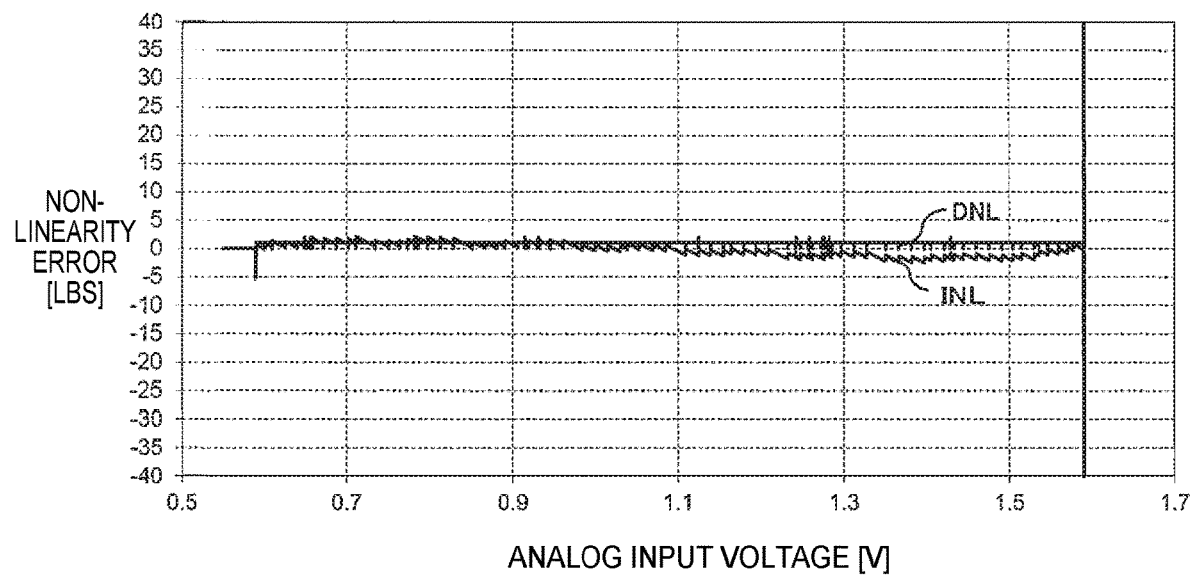
FIG. 11 is a diagram showing non-linearity error in the first layout example.

FIG. 11 is a diagram showing a simulation result of a non-linearity error of an analog-to-digital converter employing the first layout example. In FIG. 11, the horizontal axis indicates the analog input voltage [V] and the vertical axis indicates how many times larger the error of the digital signal with respect to the analog input voltage is in comparison with the LSB.

FIG. 11 shows a DNL (Differential Non-Linearity) error and an INL (Integral Non-Linearity) error, as the non-linearity errors calculated by extracting the parasitic capacitance of the analog-to-digital converter employing the first layout example. As shown in FIG. 11, DNL and INL can be significantly reduced according to the first layout example. Thus, an analog-to-digital converter that has excellent linearity accuracy can be implemented.

The invention is not limited to the exemplary embodiments described above. Various modifications can be made by those skilled in the art within the technical idea according to the invention. For example, an exemplary embodiment can be implemented by selectively combining some or all of the exemplary embodiments described above.

This application claims priority from Japanese Patent Application No. 2017-227576 filed in the Japanese Patent Office on Nov. 28, 2017, the entire disclosure of which is hereby incorporated by reference in its entirely.

What is claimed is:

1. A robot comprising:
    a base; and
    an arm that is supported to be movable with respect to the base and includes a solid- state imaging device,
    wherein the solid-state imaging device includes an analog-to-digital converter that performs analog-to-digital conversion on a pixel signal generated by reading pixel information from a light receiving element,
    the analog-to-digital converter includes:
        a comparison circuit that compares a voltage applied to a first terminal with a reference voltage applied to a second terminal, and outputs an output signal indicating a comparison result from a third terminal;
capacitive elements each of which has a first end connected to the first terminal of the comparison circuit via a first line, and includes: a first to an m-th capacitive element (where m is an integer of 2 or more) that each have a predetermined capacitance ratio; and an (m+1)-th capacitive element that has a capacitance that is substantially same as the capacitance of the first capacitive element; and
selection circuits that are connected to second ends of the capacitive elements, respectively, via second lines, and
each of the capacitive elements includes:
a first electrode disposed in a semiconductor substrate and electrically connected to the second end;
a third electrode disposed above the semiconductor substrate to oppose the first electrode and electrically connected to the second end;
a second electrode disposed between the first electrode and the third electrode, above the semiconductor substrate, to oppose the first electrode and the third electrode and electrically connected to the first end;
a first insulation film disposed between the first electrode and the second electrode;
a second insulation film disposed between the third electrode and the second electrode;
wherein the capacitive elements are configured in a capacitive cell array that includes capacitive cells disposed in rows and columns to be symmetric with respect to a symmetry axis, and
each of second to the m-th capacitive elements of the first to the m-th capacitive elements includes at least one capacitive cell disposed on one side of the symmetry axis, and the same number of capacitive cells as that disposed on the one side are disposed on the other side of the symmetry axis.

2. An analog-to-digital converter comprising:
a comparison circuit that compares a voltage applied to a first terminal with a reference voltage applied to a second terminal, and outputs an output signal indicating a comparison result from a third terminal;
capacitive elements each of which has a first end connected to the first terminal of the comparison circuit via a first line, and includes: a first to an m-th capacitive element (where m is an integer of 2 or more) that each have a predetermined capacitance ratio; and an (m+1)-th capacitive element that has a capacitance that is substantially same as the capacitance of the first capacitive element; and
selection circuits that are connected to second ends of the capacitive elements, respectively, via second lines,
wherein each of the capacitive elements includes:
a first electrode disposed in a semiconductor substrate and electrically connected to the second end;
a third electrode disposed above the semiconductor substrate to oppose the first electrode and electrically connected to the second end;
a second electrode disposed between the first electrode and the third electrode, above the semiconductor substrate, to oppose the first electrode and the third electrode and electrically connected to the first end;
a first insulation film disposed between the first electrode and the second electrode;
a second insulation film disposed between the third electrode and the second electrode;
wherein the capacitive elements are configured in a capacitive cell array that includes capacitive cells disposed in rows and columns to be symmetric with respect to a symmetry axis, and
each of second to the m-th capacitive elements of the first to the m-th capacitive elements includes at least one capacitive cell disposed on one side of the symmetry axis, and the same number of capacitive cells as that disposed on the one side are disposed on the other side of the symmetry axis.

3. The analog-to-digital converter according to claim 2, wherein the second lines are disposed in a layer higher than the first line.

4. The analog-to-digital converter according to claim 2, wherein each of second to the m-th capacitive elements includes at least two capacitive cells disposed symmetrically with respect to the symmetry axis.

5. The analog-to-digital converter according to claim 2, wherein the first capacitive element includes one capacitive cell and the (m+1)-th capacitive element includes one capacitive cell, the one capacitive cell of the first capacitive element and the one capacitive cell of the (m+1)-th capacitive element being disposed symmetrically with respect to the symmetry axis.

6. The analog-to-digital converter according to claim 2, wherein the second lines are disposed symmetrically with respect to the symmetry axis in a predetermined wiring layer.

7. The analog-to-digital converter according to claim 2, wherein, when an analog signal is converted into a digital signal, the first to the m-th capacitive elements are used to generate higher-order m bits of the digital signal through successive approximation A/D (analog-to-digital) conversion.

8. The analog-to-digital converter according to claim 7, wherein, when the analog signal is converted into the digital signal, the (m+1)-th capacitive element is used to generate an m-th bit and a subsequent bit of the digital signal through integral A/D conversion, and
the higher-order m bits of the digital signal generated through the successive approximation A/D conversion are added to the m-th bit and the subsequent bit of the digital signal generated through the integral A/D conversion.

9. An imaging device, comprising:
a light receiving element that has a photoelectric conversion function; and
the analog-to-digital converter according to claim 2, the analog-to-digital converter performing analog-to-digital conversion on a pixel signal generated by reading pixel information from the light receiving element.

* * * * *